(12) United States Patent
Hilt et al.

(10) Patent No.: US 8,809,968 B2
(45) Date of Patent: Aug. 19, 2014

(54) SEMICONDUCTOR LAYER STRUCTURE

(71) Applicant: Forschungsverbund Berlin E.V., Berlin (DE)

(72) Inventors: Oliver Hilt, Schöneiche (DE); Rimma Zhytnytska, Berlin (DE); Hans-Joachim Würfl, Zeuthen (DE)

(73) Assignee: Forschungsverbund Berlin E.V., Berlin (DE)

( * ) Notice: Subject to any disclaimer, the term of this patent is extended or adjusted under 35 U.S.C. 154(b) by 0 days.

(21) Appl. No.: 13/888,400

(22) Filed: May 7, 2013

(65) Prior Publication Data
US 2013/0241006 A1    Sep. 19, 2013

(30) Foreign Application Priority Data
May 7, 2012 (DE) .......................... 10 2012 207 501

(51) Int. Cl.
*H01L 29/02* (2006.01)
(52) U.S. Cl.
USPC ................. 257/402; 257/487; 257/E21.483; 257/E21.403; 257/E21.407
(58) Field of Classification Search
CPC .............. H01L 21/26586; H01L 29/1045; H01L 29/7835; H91L 21/823807
USPC ................... 257/402, 487, E21.403, E21.407
See application file for complete search history.

(56) References Cited

U.S. PATENT DOCUMENTS

| | | | |
|---|---|---|---|
| 2006/0060895 A1* | 3/2006 | Hikita et al. | ................... 257/280 |
| 2009/0166677 A1 | 7/2009 | Shibata et al. | |
| 2010/0207164 A1 | 8/2010 | Shibata et al. | |
| 2012/0074577 A1 | 3/2012 | Nakanishi et al. | |

OTHER PUBLICATIONS

Rowena et al. "Buffer Thickness Contribution to Suppress Vertical Leakage Current With High Breakdown Field (2.3 MV/cm) for GaN on Si", IEEE Electron Device Letters, 32(11): 1534-1536, Nov. 2011.

* cited by examiner

*Primary Examiner* — Timor Karimy

(57) ABSTRACT

This invention relates to a semiconductor layer structure. The semiconductor layer structure described includes a substrate and a buffer layer deposited onto the substrate. The semiconductor layer structure is characterized in that a drain voltage threshold lower than the breakdown voltage threshold is determined by isolating ions that are selectively implanted in just one region of the substrate into the substrate, wherein charge can dissipate from the one contact through the buffer layer towards a substrate region without isolating ions, if the one potential deviates from the other at least by the drain voltage threshold, and wherein the substrate region without isolating ions is located underneath the one contact. The semiconductor layer structure described allows dissipation of currents induced by induction in blocking active structures without damaging the active structures.

6 Claims, 5 Drawing Sheets

Figure 1 – Prior art

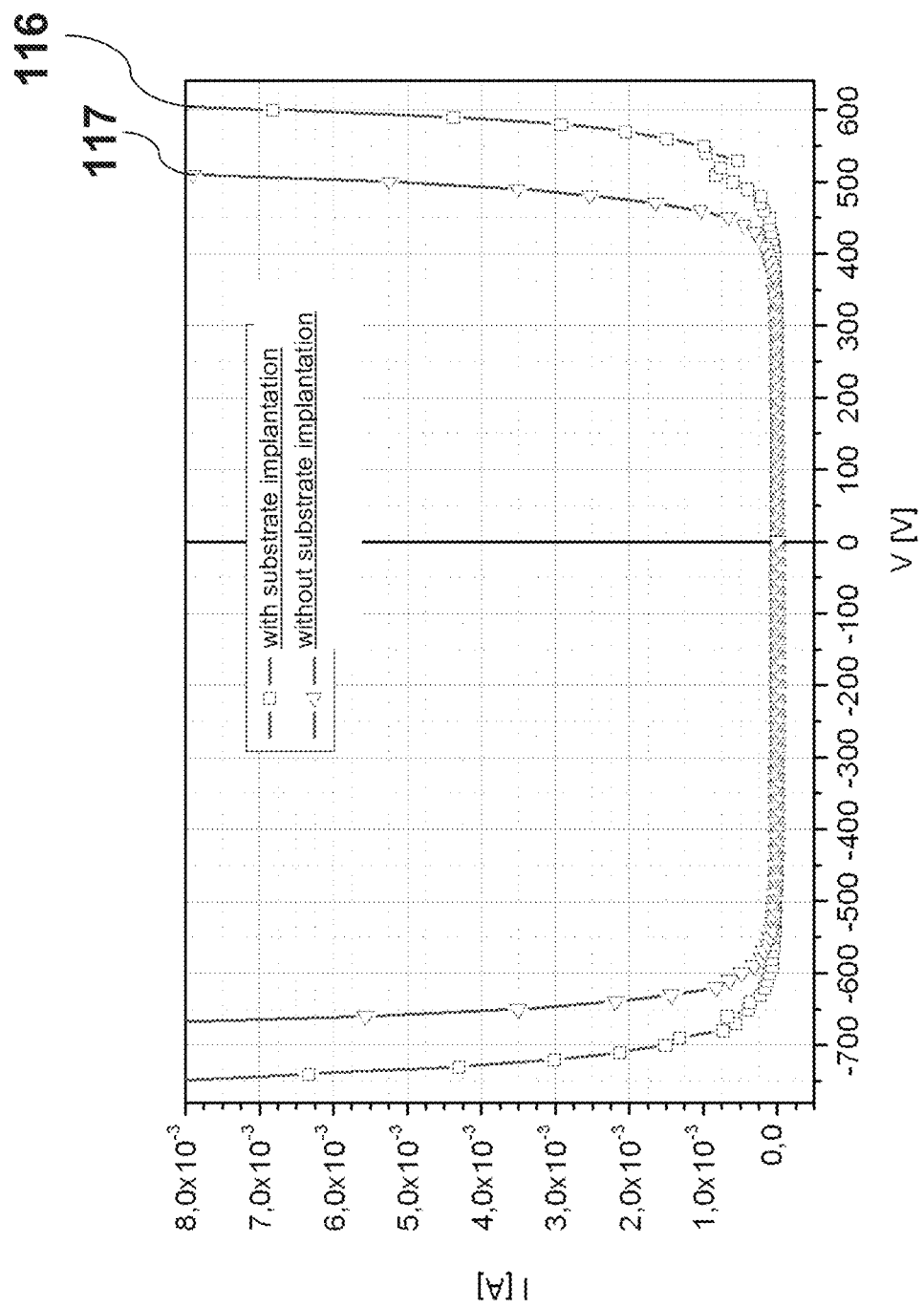

SEMICONDUCTOR LAYER STRUCTURE

RELATED APPLICATION

This application claims the benefit of priority of German Patent Application No. 10 2012 207 501.1 filed May 7, 2012, the contents of which are incorporated herein by reference in their entirety.

FIELD AND BACKGROUND OF THE INVENTION

This invention relates to a semiconductor layer structure. In particular, this invention relates to a semiconductor layer structure that allows dissipation of voltage pulses induced by induction in active blocking structures of the semiconductor layer structure without damaging the active structures.

PRIOR ART

When using power transistors and diodes as switches or amplifiers with inductive loads, inductively driven currents must be dissipated after a switch-off process via the (blocking) transistor or diode structure without damaging the same. Since the inductively driven currents cannot pass through the active blocking structure, high voltages build up at it to enforce the current flow. While Si-based power transistors, for example, can tolerate such a voltage or current pulse up to a specific energy level or can dissipate the pulse energy (avalanche resistance), even very small pulse energies may lead to component damage in other active structures, e.g. GaN-based lateral transistors (HFETs).

FIG. 1 shows a schematic cross section of such a GaN-based HFET according to prior art. In non-blocking operation, a flow of current is needed only in the transistor channel 106, which typically has a thickness of less than 100 nm. The buffer layer 107 located underneath the transistor channel 106 is typically much thicker than the channel 106, >1 μm layer thickness. When the gate 103 is blocking and a high voltage exists at the drain contact 102, leakage currents 110 flow between the drain contact and the gate contact 103 or between the drain contact and source contact 101, respectively. If the voltage at the drain contact 102 increases due to an inductively driven current, the leakage current along the current paths 110 rises considerably to dissipate the pulse energy inside or underneath the transistor channel 106, that is, to distribute or spread it. Since the thickness of the transistor channel 106 of a GaN HFET is only a few nm, this results in a high power density that can lead to component damage. In addition the field distribution in the channel 106 is highly inhomogeneous with significant maximums at the gate and drain. This further increases power density at these positions.

The voltage endurance of a blocked GaN HFET on a conductive substrate 109 is limited first by the lateral leakage current from the drain contact 102 to the source contact 101 or gate contact 103 within the transistor channel 106, and second by the vertical leakage current from the drain contact 102 through semiconductor layers 105, 106, 107, and 108 to the substrate 109.

DE 10 2009 018 054 A1 discloses laterally delimited p-type doped GaN or Si semiconductor regions to protect lateral components at various locations in the semiconductor stack. The p-n junctions created in this way are able to absorb the energy of the current/voltage peaks. The energy is dissipated laterally underneath the transistor channel or within a p-n diode structure in the Si substrate.

DE 11 2007 001 762 T5 discloses a separate protective structure for protecting a component with a wide bandgap from transient voltages, wherein the separate protective structure absorbs the voltage peaks.

U.S. Pat. No. 7,250,641 B2 describes a p-type GaN layer that forms a PIN diode with the Si substrate, so that holes created in an avalanche breakdown can discharge between the drain electrode and the Si substrate and the (lateral component) is not destroyed.

SUMMARY OF THE INVENTION

The invention proposes to use a buffer layer as an element limiting electric strength where, according to prior art, a space-charge region is created between a p-type layer and the Si substrate as a result of a p-n junction.

In particular, the invention proposes a semiconductor layer structure according to claim 1 comprising a substrate and a buffer layer deposited onto the substrate.

According to the invention, the semiconductor layer structure is characterized in that the thickness of the buffer layer and/or an ion implantation into the substrate determine(s) a drain voltage threshold that a voltage between a charge separated from the substrate by the buffer layer and a potential of the substrate must exceed for the charge to flow off through the buffer layer towards the substrate.

This structure is particularly suitable for carrying an active semiconductor structure and its protection from damage by inductively driven currents. The approach according to the invention is to use the comparatively thick buffer layer to vertically dissipate overvoltage pulses to the substrate. Due to its large volume, the power density in the buffer is low, allowing such a structure to dissipate considerably more energy without causing damage than in the transistor channel. Since the semiconductor volume of the buffer already exists in GaN HFETs, no additional chip area has to be used for integrating the vertically conductive protective structure.

In one embodiment, an active semiconductor structure is deposited onto the buffer layer, wherein the active semiconductor structure includes a channel layer formed by depositing a barrier layer and contacts deposited onto the barrier layer. The semiconductor structure is designed to permanently or temporarily prevent or limit the flow of current from one of the contacts to another one of the contacts, at least in the first direction, if a potential of the one of the contacts deviates from the potential of the other of the contacts by less than a breakdown voltage threshold. The semiconductor structure is characterized in that the potential of the substrate corresponds to the other potential of the other of the contacts and the drain voltage threshold is lower than the breakdown voltage threshold. This allows voltages induced by induction to be dissipated vertically through the buffer layer to the substrate.

Other embodiments are described in the dependent claims.

BRIEF DESCRIPTION OF THE DRAWINGS

Embodiments of the invention are explained in greater detail with reference to the drawings and the description below.

In the drawings:

FIG. 5 shows the dependence of the vertical leakage current towards the substrate for the ion-implanted and the non-ion-implanted substrate area using the example of a carbon-doped GaN buffer grown on an n-conductive SiC substrate.

DESCRIPTION OF SPECIFIC EMBODIMENTS OF THE INVENTION

Figure 2:
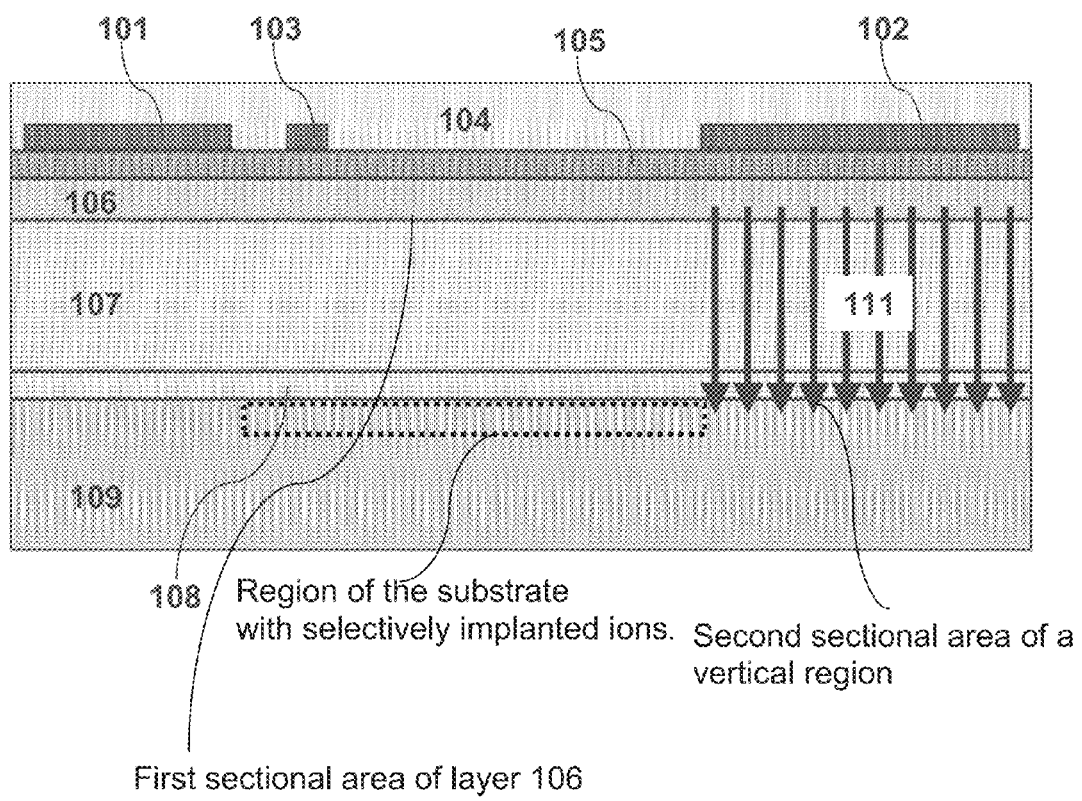
FIG. 2 shows a schematic cross section through a first embodiment of the invention.

FIG. 2 shows a schematic cross section through a first embodiment of the semiconductor layer structure according to the invention. An optional nucleation layer 108 and a buffer 107 located on top of it are both deposited on a conductive substrate 109. The buffer 107 is thick compared to a layer 106 that was deposited onto the buffer 107 for forming an active structure. The active structure can at least be designed as a diode or a transistor.

In the example shown, the layer 106 constitutes a transistor channel of a GaN HFET that, in addition to the layer 106, includes a barrier layer 105 located on top of the layer 106. The layer 106 of the exemplary GaN HFET is not conductive per se. The two-dimensional electron gas (2DEG) required for suitability as transistor channel is only formed in the layer 106 at the border with the barrier 105 if the barrier layer 105 has grown out of the layer 106, for a GaN HFET, for example, from AlGaN. Active structures designed as GaN diodes or GaN HFETs further comprise source contacts 101 and drain contacts 102 located on the barrier layer 105. In a transistor design, a gate contact 103 is provided between the source contact 101 and the drain contact 102. The active structures in the example from FIG. 2 are covered and protected by a passivation 104.

Figure 1:
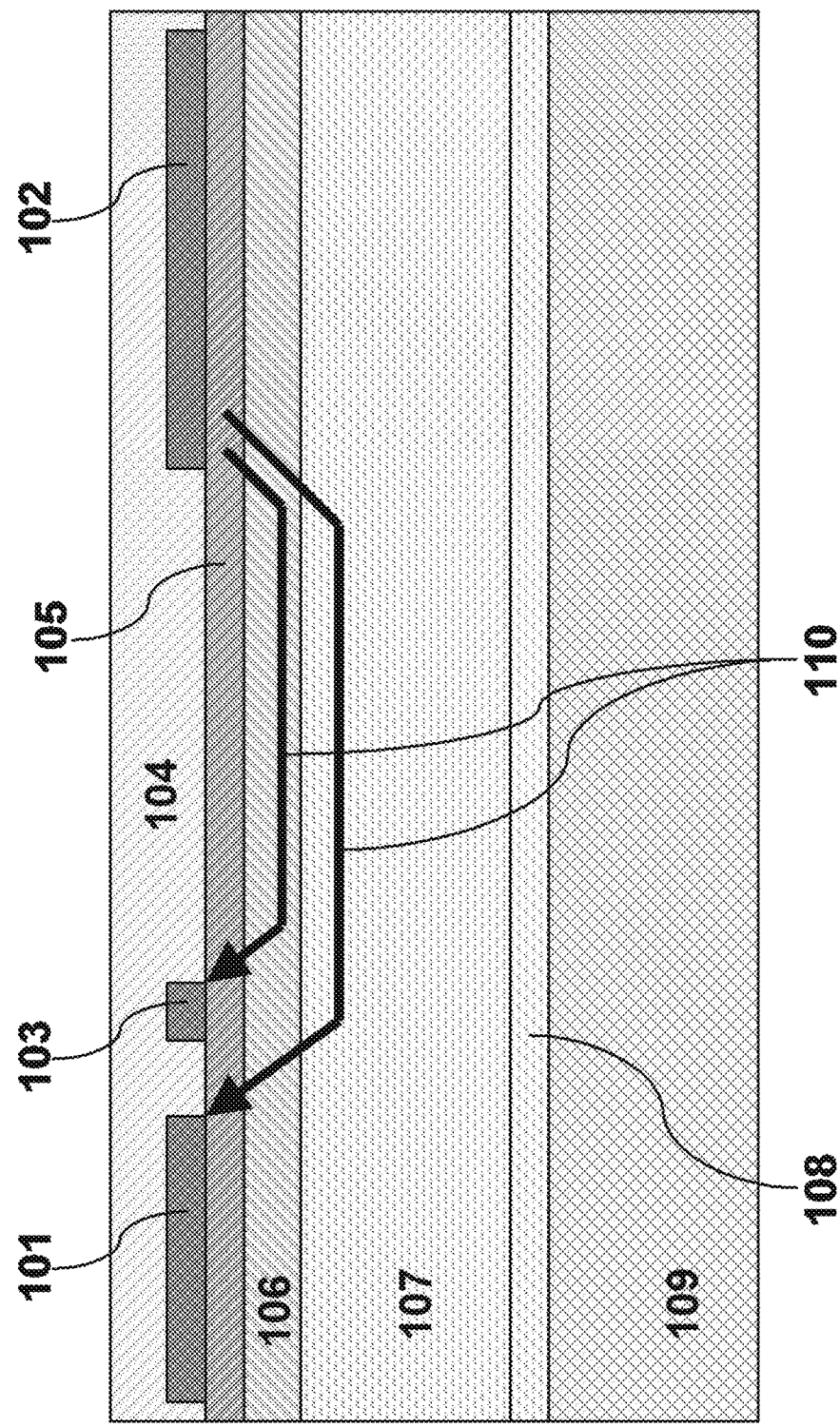
FIG. 1 shows a schematic cross section through a GaN-based HFET according to prior art and potential destructive current paths.

The thickness of the buffer layer 107 is selected based on its vertical conductivity behavior. Thickness is selected such that it opens an alternative current path 111 for energy dissipation above a drain voltage within the semiconductor structure of the exemplary GaN transistor. The current path in the example shown is located between an ohmic (drain) contact 102 on the semiconductor surface and the conductive substrate 109 at source potential on which the semiconductor layers 108, 107, 106, and 105 have grown. Most of the voltage drop between the drain contact 102 and the substrate 109 is to drop from the GaN-based semiconductor buffer 107. The pulse energy within the buffer can dissipate at a low power density due to the large volume of the buffer. This volume is marked by arrows 11 in FIG. 2. This means that the current path 110 from FIG. 1 with its high power density does no longer have to be used for dissipating the energy of inductively driven current pulses at the drain 102 of a closed GaN HFET.

Alternatively, the substrate can be at the level of the drain potential, and the current path 111 can be present between a source contact 101 and the substrate 109.

Setting the layer thickness of the buffer 107 and/or selective ion implantation into the substrate can be used to determine that the alternative vertical current path 111 becomes available at voltages below the breakdown voltage of the transistor, which is determined by lateral transistor dimensions such as the gate-drain distance. Alternatively, or in addition, it can be determined that the alternative vertical current path 111 becomes available above an operating voltage threshold only, wherein the operating voltage threshold is not permanently exceeded in blocking operation of the active structure.

Above the operating voltage threshold, the substrate leakage current through the semiconductor structures 106 . . . 108 of the invention in FIG. 2 typically shows an exponential (at any rate a super-linear or sudden) increase as the voltage increases.

Figure 3:
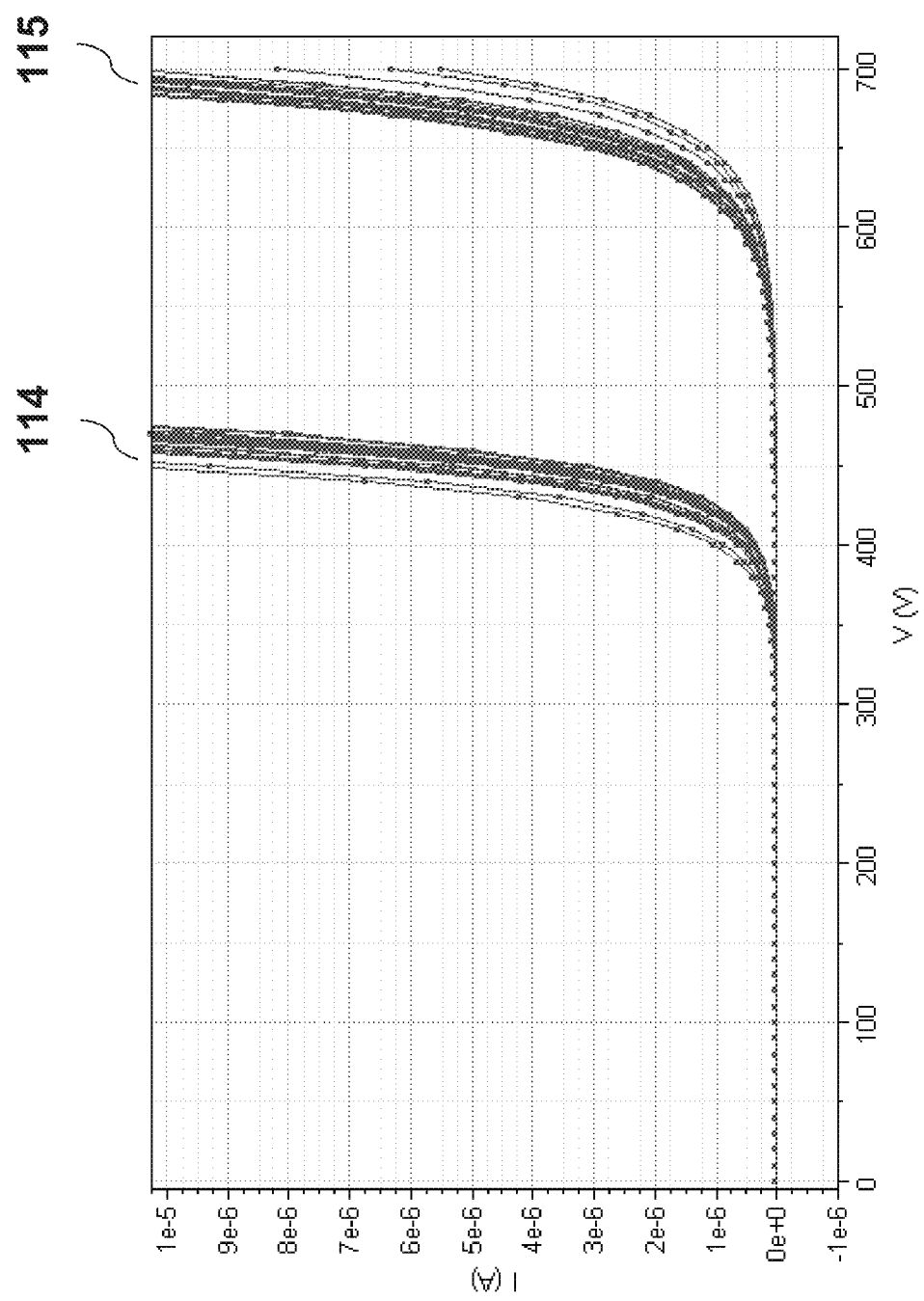
FIG. 3 shows a dependence of a substrate leakage current on the layer thickness of a buffer layer using the example of a carbon-doped GaN buffer layer.

FIG. 3 shows the dependence of the vertical leakage current on the thickness of the buffer and the voltage applied, using the example of a carbon-doped GaN buffer, wherein the leakage current flows through the buffer to the substrate. Measurements 114 at a buffer layer thickness of 3 μm show that the substrate leakage current is negligible up to a voltage of 300 volts and increases faster than a linear increase at voltages over 400 volts. Measurements 115 at a buffer layer thickness of 4 μm show that the substrate leakage current is negligible up to a voltage of 500 volts and increases faster than a linear increase at voltages over 600 volts only. It is apparent that the blocking capability of the 4 μm buffer is about 150-200 V higher than that of the 3 μm buffer.

Figure 4:
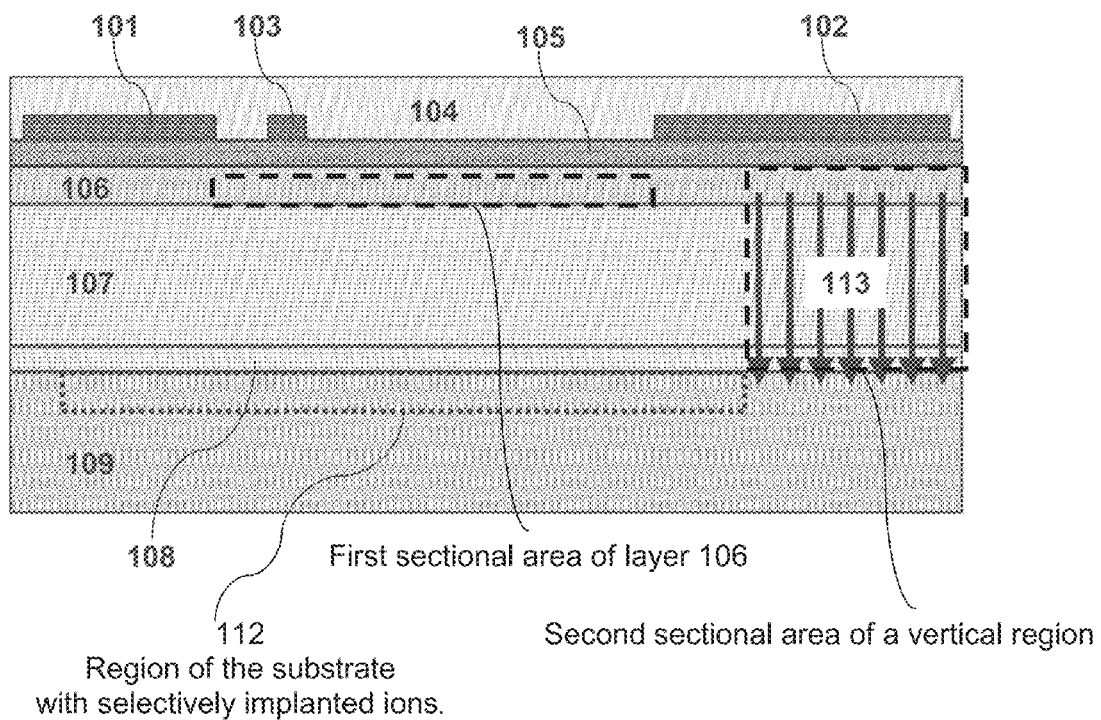
FIG. 4 shows a schematic cross section through a second embodiment of the invention.

FIG. 4 shows in an exemplary manner how a suitable selective ion implantation into substrate areas 112 in a region above which the drain contact 102 is to be, or is, deposited, how it can be shifted to areas 113 outside the active transistor structure, thus protecting the same even better. The position and volume of energy dissipation can be determined by suitable lateral dimensioning of the implanted areas 112 and the drain contact 102, for example to control local heating-up of the transistor.

The substrate leakage current in the semiconductor structure can be reduced if the surface of the conductive substrate 109 (e.g. Si or doped SiC) is isolation-implanted at the lateral positions of the transistor structure before the semiconductor layers 107 and 108 grow. An implantation in the order of magnitude of several 100 keV produces an additional insulating layer 112 in the substrate 109.

FIG. 5 uses the example of a carbon-doped GaN buffer with n-conductive SiC as the substrate to show the dependence of the vertical leakage current towards the substrate on an argon implantation into the substrate and the voltage applied. It can be seen that the substrate leakage current increases considerably above 400 volts with Ar implantation (measurements 116) and without Ar implantation (measurements 117), wherein the increase is clearly weaker with Ar implantation (measuring points shown as squares) than without Ar implantation (measuring points shown as triangles) so that a suitable Ar implantation can increase the blocking capability by at least 100 V. The blocking capability and drain voltage can be set precisely by selecting the implanted substance and the density and energies at which this substance is implanted.

What is claimed is:

1. A semiconductor layer structure comprising a substrate, a buffer layer deposited onto the substrate, and an active semiconductor layer stack deposited onto the buffer layer, wherein the active semiconductor layer stack includes a layer formed as a channel by depositing a barrier layer, and contacts deposited onto the barrier layer, wherein the semiconductor layer structure is designed to permanently or temporarily prevent or limit, at least in a first direction, a lateral flow of current from one of the contacts to one of the other contacts through the layer if a potential of the one of the contacts deviates from another potential of the other of the contacts by less than a breakdown voltage threshold, wherein; a potential of the substrate corresponds to the other potential, and in that a drain voltage threshold lower than the breakdown voltage threshold is determined by isolating argon ions that are selectively implanted into the substrate such that the isolating argon ions are in just one region of the substrate said just one region of the substrate with isolating argon ions implanted being laterally adjacent to a substrate region without isolating argon, wherein charge can dissipate from the one contact through the buffer layer towards said substrate region without isolating argon ions, if the one potential deviates from the other at least by the drain voltage threshold, and wherein the substrate region without isolating argon ions is located underneath the one contact.

2. The semiconductor layer structure according to claim 1, wherein in a cross section through the semiconductor structure, a first sectional area of the layer in the region between the one and the other contact is smaller than a second sectional area of a region between the one of the contacts and the substrate region without isolating ions.

3. The semiconductor layer structure according to claim 1, wherein the drain voltage threshold is greater than a minimum voltage that may permanently exist between the one and the other contacts without the occurrence of a flow of current that damages the semiconductor structure.

4. The semiconductor layer structure according to claim 1, wherein the implanted isolating ions include a formation of a p-n junction in at least one region on a surface of the substrate onto which the buffer layer is deposited.

5. The semiconductor layer structure according to claim 1, wherein the active semiconductor structure forms a transistor and includes a gate contact deposited between the contacts on the barrier layer.

6. The semiconductor layer structure according to claim 1, wherein the active semiconductor structure forms a diode with the one contact and the other contact.

* * * * *